(12) United States Patent
Khan

(10) Patent No.: US 11,739,413 B2
(45) Date of Patent: Aug. 29, 2023

(54) OXIDATION PROTECTION SYSTEMS AND METHODS

(71) Applicant: GOODRICH CORPORATION, Charlotte, NC (US)

(72) Inventor: Atta Khan, Colorado Springs, CO (US)

(73) Assignee: GOODRICH CORPORATION, Charlotte, NC (US)

( * ) Notice: Subject to any disclaimer, the term of this patent is extended or adjusted under 35 U.S.C. 154(b) by 75 days.

(21) Appl. No.: 16/432,029

(22) Filed: Jun. 5, 2019

(65) Prior Publication Data

US 2020/0385852 A1    Dec. 10, 2020

(51) Int. Cl.
*C23C 14/06*    (2006.01)
*B64C 25/42*    (2006.01)
*F16D 65/00*    (2006.01)

(52) U.S. Cl.
CPC .......... *C23C 14/0635* (2013.01); *B64C 25/42* (2013.01); *F16D 65/0025* (2013.01)

(58) Field of Classification Search
CPC ................................................ C23C 14/0635
See application file for complete search history.

(56) References Cited

U.S. PATENT DOCUMENTS

| | | | | |
|---|---|---|---|---|
| 3,379,647 A * | 4/1968 | Smudski | ................. | C01B 35/04 423/291 |
| 3,885,022 A * | 5/1975 | Harris | ................... | C01B 32/991 423/291 |
| 4,668,579 A * | 5/1987 | Strangman | ............ | C04B 41/009 428/367 |
| 5,736,232 A | 4/1998 | Shih et al. | | |
| 7,378,362 B2 * | 5/2008 | Nixon | ................... | C04B 35/565 428/293.4 |
| 7,635,458 B1 | 12/2009 | Hung | | |
| 9,725,803 B2 | 8/2017 | Le Costaouec et al. | | |
| 9,957,199 B2 | 5/2018 | Keller et al. | | |
| 2004/0213906 A1 * | 10/2004 | Mazany | ................ | C04B 41/009 427/249.1 |
| 2005/0101698 A1 * | 5/2005 | Harada | ..................... | G02B 1/04 523/210 |
| 2011/0189504 A1 * | 8/2011 | Zou | ....................... | C23C 18/127 428/698 |
| 2019/0092698 A1 | 3/2019 | Kirkpatrick et al. | | |

FOREIGN PATENT DOCUMENTS

| | | |
|---|---|---|
| BE | 1008162 | 2/1996 |
| CN | 102515811 | 10/2013 |
| EP | 0470717 | 2/1992 |
| GB | 2266098 | 10/1993 |
| JP | H0524921 | 2/1993 |
| JP | H0733565 | 2/1995 |
| WO | 2008105895 | 9/2008 |

OTHER PUBLICATIONS

Mondal, Low-temperature synthetic route for boron carbide, Journal of the European Ceramic Society, 25 (2005), p. 287-291 (Year: 2005).*

Devecerski, Fabrication of SiC by carbothermal-reduction reactions of mountain leather asbestos, Journal of Alloys and Compounds, 464, 2008, p. 270-276 (Year: 2008).*

European Patent Office, European Search Report dated Jul. 2, 2020 in Application No. 19215263.5.

* cited by examiner

*Primary Examiner* — Tabatha L Penny
(74) *Attorney, Agent, or Firm* — SNELL & WILMER L.L.P.

(57) ABSTRACT

A method of forming a $B_4C$ layer as a component of an oxidation protection system as component of oxidation protection system on a carbon-carbon composite material may include forming a liquid mixture comprising a boron-compound and a carbon-compound. The method may further include applying the liquid mixture on the carbon-carbon composite material. The boron compound may comprise boric acid ($H_3BO_3$). In various embodiments, the carbon-compound comprises phenolic resin. In various embodiments, the method further includes heating the carbon-carbon composite material after applying the liquid mixture on the carbon-carbon composite material to from a boron carbide ($B_4C$) layer.

9 Claims, 5 Drawing Sheets

OXIDATION PROTECTION SYSTEMS AND METHODS

FIELD

The present disclosure relates generally to composites and, more specifically, to oxidation protection systems for carbon-carbon composite structures.

BACKGROUND

Aircraft typically utilize brake systems on wheels to slow or stop the aircraft during landings, taxiing and rejected takeoffs. Aircraft brake systems generally employ a brake stack comprising a series of friction disks that may be forced into sliding contact with one another during brake actuation to slow or stop the aircraft. The brake stack typically comprises rotor disks and stator disks that, in response to axial compressive pressure, convert the kinetic energy of the aircraft into heat through frictional forces experienced between the friction disks. Brake stacks may exhibit static and dynamic frictional performance that vary greatly in response to environmental conditions (e.g., ambient temperature or humidity) and to the type of braking operation being performed (e.g., short runway take-off, landing or rejected take off).

Oxidation protection systems for carbon-carbon composites are typically designed to minimize loss of carbon material due to oxidation at operating conditions, which include temperatures of 900° C. (1652° F.) or higher. Phosphate-based oxidation protection systems may reduce infiltration of oxygen and oxidation catalysts into the composite structure. However, despite the use of such oxidation protection systems, significant oxidation of the carbon-carbon composites may still occur during operation of components such as, for example, aircraft braking systems. In addition, at such high operating temperatures, phosphate-based oxidation protection systems (OPS) applied to non-wear surfaces of brake disks may experience decreasing viscosity, which may cause the OPS to migrate away from non-wear surface edges proximate to a wear surface of the brake disk, leaving the composite material at or proximate to the non-wear surface edges vulnerable to oxidation. Even further, at the high operating temperatures, components in the OPS may oxidize, and in some cases, evaporate from the OPS, lessening the oxidation protection capabilities.

SUMMARY

In various embodiments, the present disclosure provides a method of forming a $B_4C$ layer as a component of an oxidation protection system on a carbon-carbon composite material. The method includes forming a liquid mixture comprising a boron-compound and a carbon-compound. The method may further include applying the liquid mixture on the carbon-carbon composite material.

In various embodiments, the boron compound comprises boric acid ($H_3BO_3$). In various embodiments, the carbon-compound comprises phenolic resin. In various embodiments, the method further includes heating the carbon-carbon composite material after applying the liquid mixture on the carbon-carbon composite material to from a boron carbide ($B_4C$) layer. Heating the carbon-carbon composite material comprises heating to between about 1000 degrees Celsius and about 2000 degrees Celsius under an inert gas flow, according to various embodiments. The heating may be performed for 1 min to 15 hours.

The boron-compound may include a boroxine compound. For example, the boroxine compound may include trimethyl boroxine. In various embodiments, the boron-compound comprises trimethyl borate. In various embodiments, the carbon-compound comprises glycerol. In various embodiments, the method includes adjusting the viscosity of the liquid mixture before applying the liquid mixture on the carbon-carbon composite material. In various embodiments, the method further includes forming a silicon carbide layer on the carbon-carbon composite.

Also disclosed herein, according to various embodiments, is a method of forming a $B_4C$ layer as a component of an oxidation protection system on a carbon-carbon composite material. The method may include forming a liquid mixture comprising a boron-compound and applying the liquid mixture on the carbon-carbon composite material. In various embodiments, the boron compound comprises boric acid ($H_3BO_3$). The liquid mixture may include at least one of water, methanol, ethanol, propanol, butanol, and glycerol.

Also disclosed herein, according to various embodiments, is a method of forming a $B_4C$ layer as a component of an oxidation protection system on a carbon-carbon composite material. The method may include preheating the carbon-carbon composite material, heating a boron-compound to form boron oxide vapors, and introducing these vapors to the preheated carbon-carbon composite material. The boron-compound may include diboron trioxide ($B_2O_3$) and/or trimethyl borate. Heating the boron-compound may be performed under vacuum.

The forgoing features and elements may be combined in various combinations without exclusivity, unless expressly indicated herein otherwise. These features and elements as well as the operation of the disclosed embodiments will become more apparent in light of the following description and accompanying drawings.

Figure 1A:
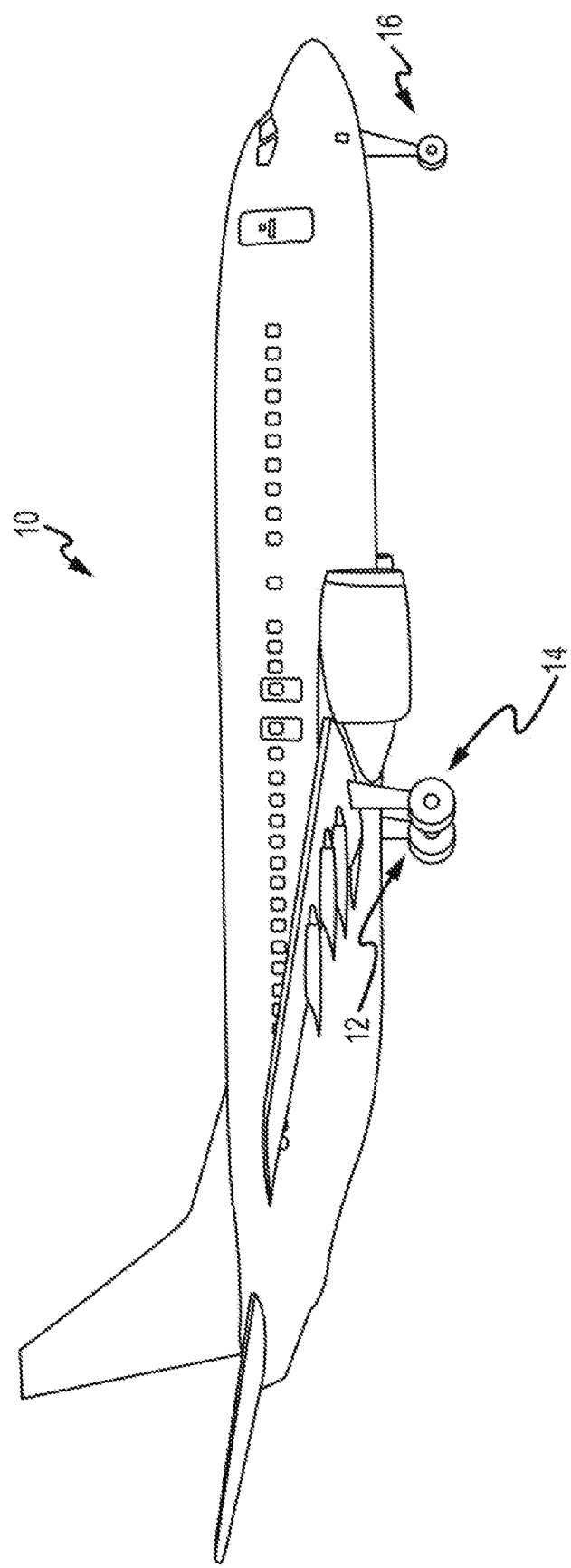
FIG. 1A illustrates an exemplary aircraft having a brake system, in accordance with various embodiments.

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein without departing from the spirit and scope of the disclosure. Thus, the detailed description herein is presented for purposes of illustration only and not of limitation.

Disclosed herein, according to various embodiments, is a sealed circuit card assembly and its method of manufacture. The sealed circuit card assembly and its related method of manufacture, as described in greater detail below, may be implemented in various types of electrical connection systems. For example, the sealed circuit card assembly may be implemented in a brake assembly of an aircraft.

Referring to FIG. 1A, in accordance with various embodiments, an aircraft 10 is illustrated. The aircraft 10 includes landing gear, which may include a left main landing gear 12, a right main landing gear 14 and a nose landing gear 16. The landing gear support the aircraft 10 when it is not flying, allowing the aircraft 10 to taxi, take off and land without damage. While the disclosure refers to the three landing gear configurations just described, the disclosure nevertheless contemplates any number of landing gear configurations.

Figure 1B:
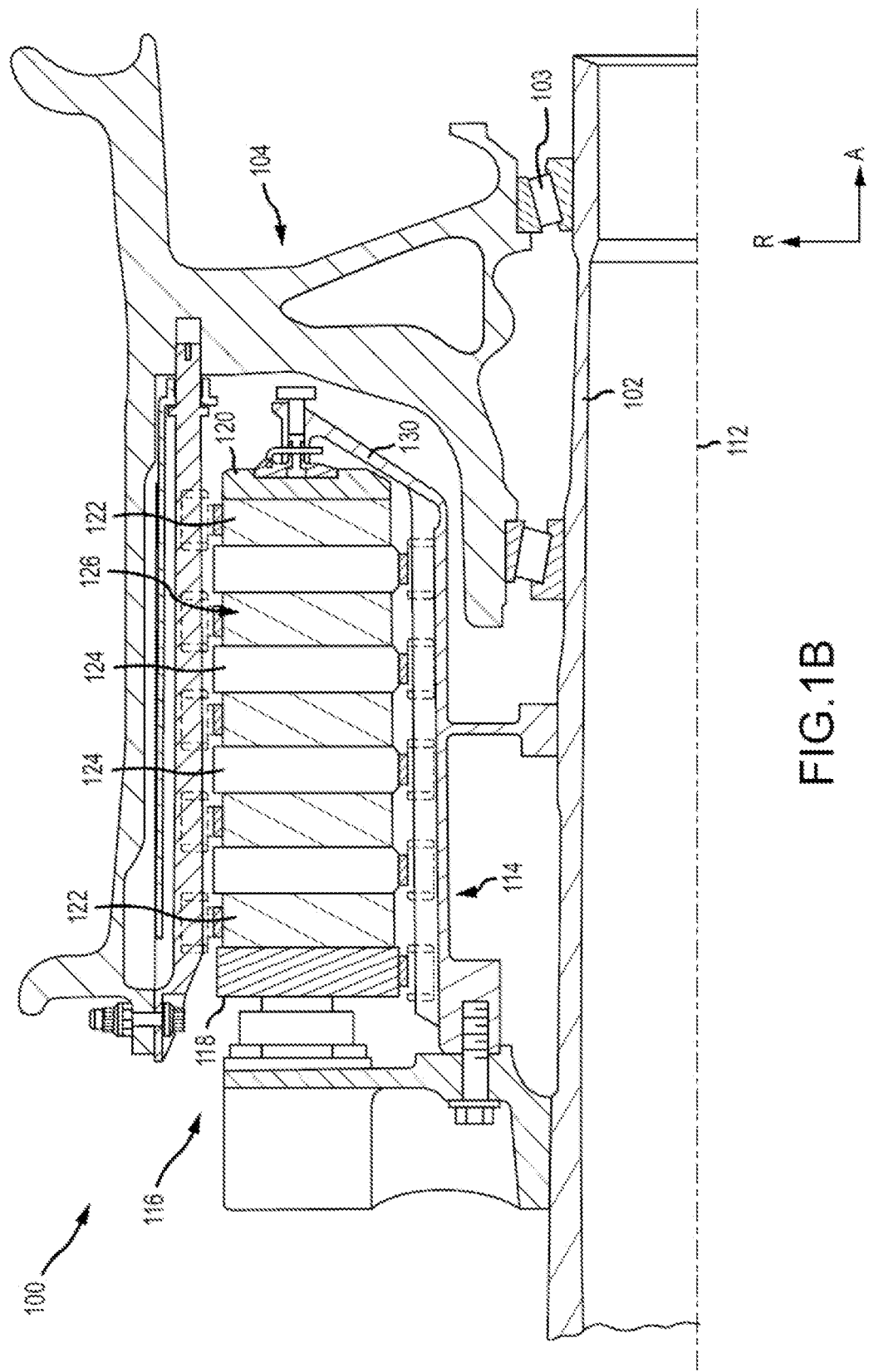
FIG. 1B illustrates a cross-sectional view of a brake assembly, in accordance with various embodiments.

Referring now to FIG. 1B, there is schematically depicted a brake mechanism 100 configured for use on a landing gear, such as, for example, each of the left main landing gear 12 and the right main landing gear 14 described above with reference to FIG. 1A. In various embodiments, the brake mechanism is mounted on an axle 102 for use with a wheel 104 disposed on and configured to rotate about the axle 102 via one or more bearing assemblies 103. A central axis 112 extends through the axle 102 and defines a center of rotation of the wheel 104. A torque plate barrel 114 (sometimes referred to as a torque tube or barrel or a torque plate) is aligned concentrically with the hub 106, and the wheel 104 is rotatable relative to the torque plate barrel 114.

The brake mechanism 100 includes a piston assembly 116, a pressure plate 118 disposed adjacent the piston assembly 116, an end plate 120 positioned a distal location from the piston assembly 116, and a plurality of rotor disks 122 interleaved with a plurality of stator disks 124 positioned intermediate the pressure plate 118 and the end plate 120. The pressure plate 118, the plurality of rotor disks 122, the plurality of stator disks 124 and the end plate 120 together form a brake heat sink or brake stack 126. The pressure plate 118, the end plate 120 and the plurality of stator disks 124 are mounted to the torque plate barrel 114 and remain rotationally stationary with the axle 102. The plurality of rotor disks 122 is mounted to the wheel 104 and rotate with respect to each of the pressure plate 118, the end plate 120 and the plurality of stator disks 124.

An actuating mechanism for the brake mechanism 100 includes a plurality of piston assemblies, including the piston assembly 116, circumferentially spaced around a piston housing 156 (only one piston assembly is illustrated in FIG. 1B). Upon actuation, the plurality of piston assemblies affects a braking action by urging the pressure plate 118 and the plurality of stator disks 124 into frictional engagement with the plurality of rotor disks 122 and against the end plate 120. Through compression of the plurality of rotor disks 122 and the plurality of stator disks 124 between the pressure plate 118 and the end plate 120, the resulting frictional contact slows or stops or otherwise prevents rotation of the wheel 104.

Figure 2:
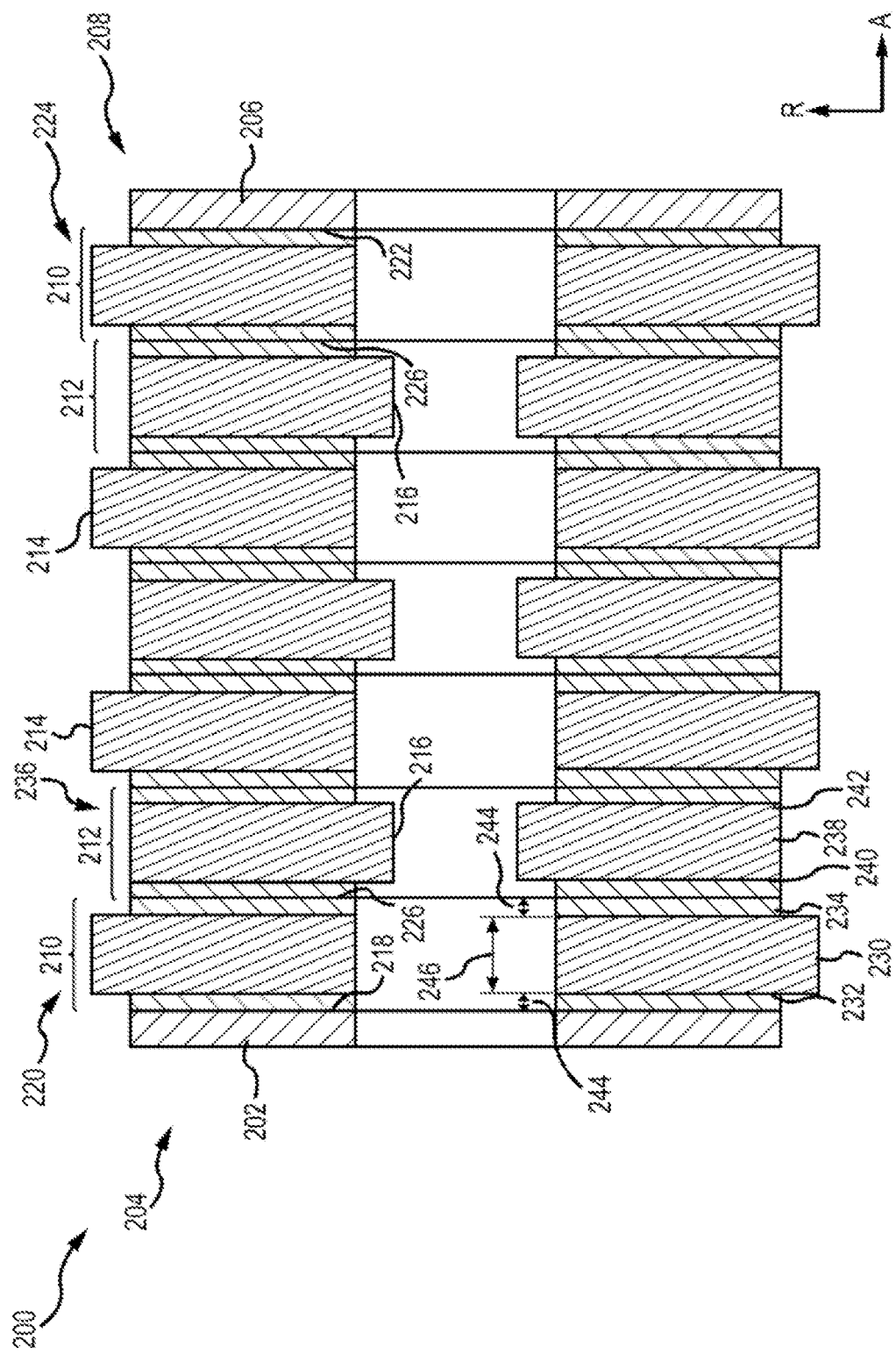
FIG. 2 illustrates a schematic view of a brake stack, in accordance with various embodiments.

Referring now to FIG. 2, a brake stack 200, such as, for example, the brake stack 126 described above with reference to FIG. 1B, is illustrated, in accordance with various embodiments. The brake stack 200 includes a pressure plate 202 disposed at a first end 204 of the brake stack 200, an end plate 206 disposed at a second end 208 of the brake stack 200, and a plurality of rotor disks 210 interleaved with a plurality of stator disks 212 positioned intermediate the pressure plate 202 and the end plate 206. In operation, each of the plurality of rotor disks 210 is configured to rotate in accordance with a wheel, such as, for example, the wheel 104 described above with reference to FIG. 1B. A plurality of circumferentially spaced rotor lugs 214 is disposed on each of the plurality of rotor disks 210 and configured to engage the wheel to affect co-rotation between the wheel and the plurality of rotor disks 210. Conversely, the plurality of stator disks 212 is configured to remain stationary relative to the plurality of rotor disks 210 during rotation of the wheel and the plurality of rotor disks 210. A plurality of circumferentially spaced stator lugs 216 is disposed on each of the plurality of stator disks 212 and configured to engage an axle, such as, for example, the axle 102 described above with reference to FIG. 1B.

As described above, one or more rams or pistons may axially urge the pressure plate 202, whether directly or through an intermediate component, into forceful engagement with the plurality of rotor disks 210 and the plurality of stator disks 212. The axial compression of the plurality of rotor disks 210, which are rotating with the wheel, and the plurality of stator disks 212, which are stationary with the axle, causes friction between the various surfaces comprising the brake stack 200, including a first surface 218 between the pressure plate 202 and a first rotor disk 220 disposed adjacent the pressure plate 202, an Nth surface 222 between the end plate 206 and an Mth rotor disk 224 disposed adjacent the end plate 206, and a plurality of intermediate surfaces 226 between adjacent pairs of the plurality of rotor disks 210 and the plurality of stator disks 212. Here, the number of surfaces, N, is typically equal to twice the number of rotor disks, M. The friction occurring at the various surfaces just defined results in the conversion of kinetic energy (e.g., the translational kinetic energy of an aircraft) into heat energy that is ultimately dissipated throughout the brake stack 200.

In various embodiments, each of the plurality of rotor disks 210, such as, for example, the first rotor disk 220, includes a rotor core 230 disposed between a first rotor wear liner 232 and a second rotor wear liner 234. Similarly, each of the plurality of stator disks 212, such as, for example, a first stator disk 236 disposed adjacent the first rotor disk 220, includes a stator core 238 disposed between a first stator wear liner 240 and a second stator wear liner 242. The plurality of intermediate surfaces 226 may thus be more specifically identified as the opposing faces occurring between adjacent pairs of rotor and stator wear liners, such as, for example, the opposing faces occurring between the second rotor wear liner 234 and the first stator wear liner 240. In similar fashion, the first surface 218 between the pressure plate 202 and the first rotor disk 220 may be more specifically identified as the opposing faces occurring between the pressure plate 202 and the first rotor wear liner 232 of the first rotor disk 220, while the Nth surface 222 between the end plate 206 and the Mth rotor disk 224 may be more specifically identified as the opposing faces occurring between the end plate 206 and the second rotor wear liner 234 of the Mth rotor disk 224.

In accordance with various embodiments, the rotor core 230 within each of the plurality of rotor disks 210 is comprised of a carbon-carbon composite material. The carbon-carbon composite material may be formed from a carbon fiber preform that is densified (e.g., by a chemical vapor infiltration process) with carbon. In various embodiments, and with reference to FIGS. 3 and 4, methods of forming a $B_4C$ layer as a component of an oxidation protection system on the carbon-carbon composite material are provided. Generally, the methods of forming a $B_4C$ layer as a component of an oxidation protection system on the carbon-carbon composite material comprise forming a boron carbide ($B_4C$) layer on the carbon-carbon composite material.

Figure 3:
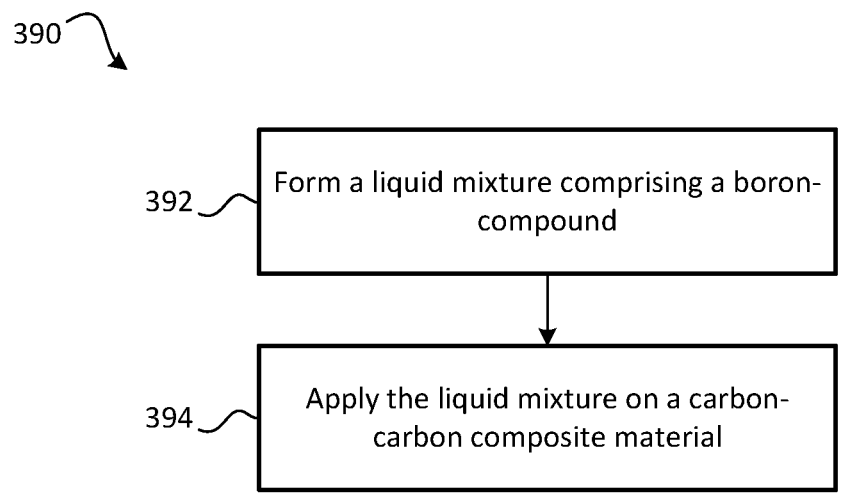
FIGS. 3, 4, 5, and 6 are schematic flow chart diagrams of methods of forming a $B_4C$ layer as a component of an oxidation protection system on a carbon-carbon composite material, in accordance with various embodiments.

In various embodiments, and with reference to FIG. 3, the method 390 of forming a $B_4C$ layer as a component of an oxidation protection system comprises forming a liquid mixture comprising a boron-compound at step 392. The method 390 may further include applying the liquid mixture on the carbon-carbon composite material at step 394. In various embodiments, and with reference to FIG. 4, the method 490 may further include heating the carbon-carbon composite material, after applying the liquid mixture, to form the boron carbide ($B_4C$) layer at step 496. The liquid mixture may include a carbon-compound, as described in greater detail below, which reacts with the boron-compound to form the boron carbide ($B_4C$) layer. In various embodiments, however, the boron-compound reacts with carbon from the carbon-carbon composite material (instead of a separate carbon-compound) to form the boron carbide ($B_4C$) layer.

As used herein, the term "boron-compound" may refer to a precursor of boron carbide ($B_4C$) layer. That is, the boron-compound is applied to the carbon-carbon composite material, and then the boron-compound is subsequently reacted/converted to make boron carbide ($B_4C$). The term "boron-compound" may refer to boric acid ($H_3BO_3$), diboron trioxide or boria ($B_2O_3$), a boroxine compound (e.g., trimethyl boroxine), and/or trimethyl borate, among other boron containing compounds. In embodiments in which the liquid mixture includes a carbon-compound, the carbon-compound may include phenolic resin, glycerol, polyvinyl alcohol, and/or sugar. The boron-compound may be mixed in the carbon-compound. For example, the liquid mixture may be a solution, and the boron-compound may be the solute and the carbon-compound may be the solvent. In various embodiments, a solvent like water or alcohol could be used to make a solution of boron and carbon compounds. In various embodiments, the method of forming the $B_4C$ layer further includes modifying the viscosity of the liquid mixture by adding other liquid constituents. In various embodiments, the liquid mixture may include water and/or alcohols, such as methanol, ethanol, propanol, and butanol.

Figure 4:
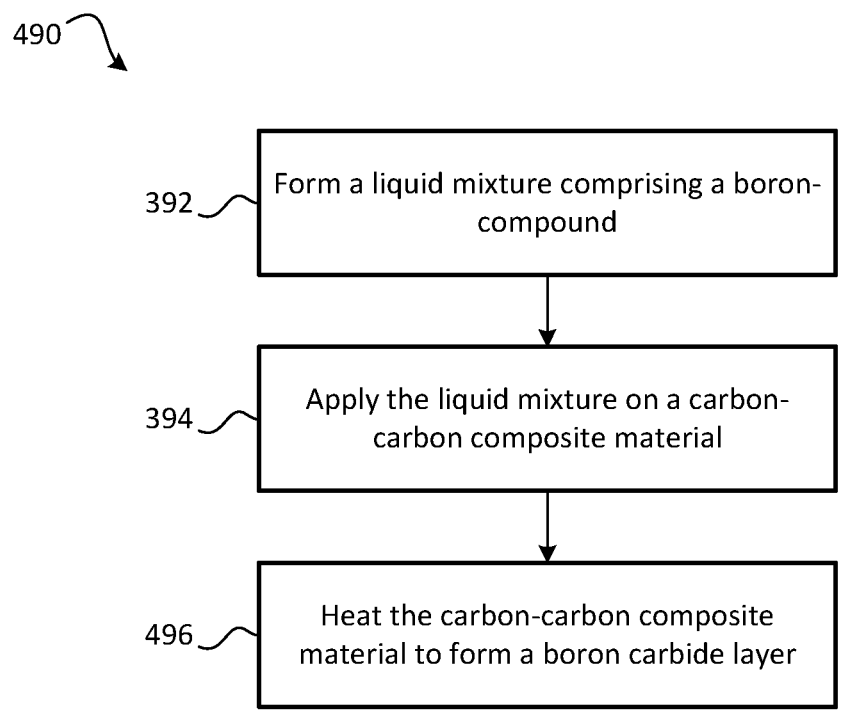

In various embodiments, and with reference to FIG. 4, step 496 may include heating the carbon-carbon composite material to between about 1000 degrees Celsius and about 2000 degrees Celsius. In various embodiments, heating the carbon-carbon composite material includes heating the carbon-carbon composite material to between about 1400 degrees Celsius and about 1600 degrees Celsius. As used in this context only, the term "about" refers to plus or minus 5% of the indicated value. In various embodiments, the heating of step 496 may be performed under vacuum. In various embodiments, the heating of step 496 may be performed for about 1 hour (plus or minus 10 minutes). In various embodiments, the method may further include forming a silicon carbide (SiC) layer on the boron carbide ($B_4C$) layer.

Figure 5:
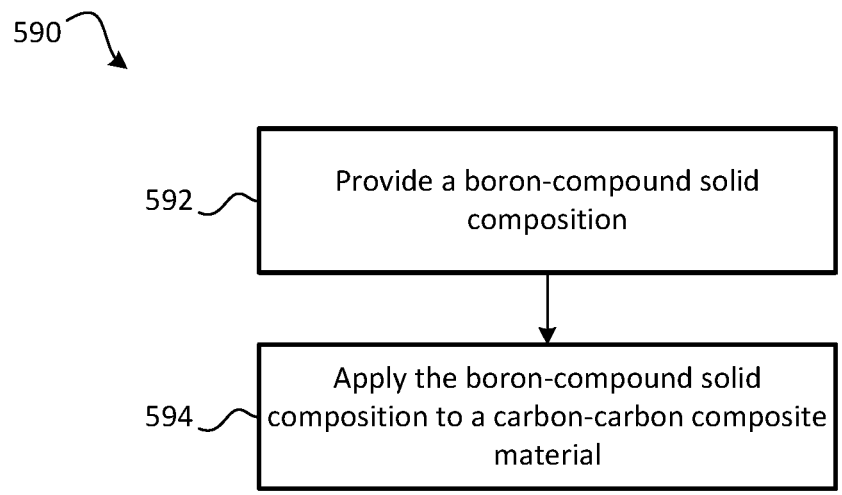
Figure 6:
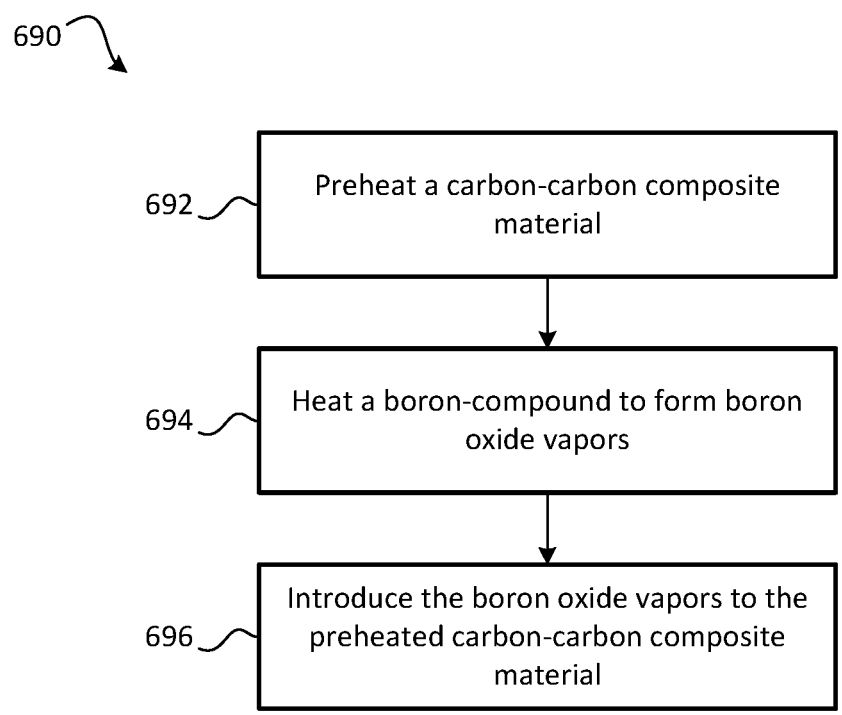

In various embodiments, and with reference to FIG. 5, another method 590 of forming a $B_4C$ layer as a component of an oxidation protection system is provided. Method 590 includes, according to various embodiments, providing a boron-compound solid composition at step 592. In various embodiments, method step 592 includes forming a boron-compound in a solid state. The method 590 further includes applying the solid boron compound to the carbon-carbon composite material at step 594. As previously discussed, the method may further include heating the carbon-carbon composite material to form the boron carbide ($B_4C$) layer. In various embodiments, and with reference to FIG. 6, another method 690 of forming a $B_4C$ layer as a component of an oxidation protection system is provided. The method 690 includes preheating the carbon-carbon composite material at step 692, heating a boron-compound to form boron oxide vapors at step 694, and then introducing the boron oxide vapors to the preheated carbon-carbon composite material at step 696.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. All ranges and ratio limits disclosed herein may be combined.

Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Also, any reference to attached, fixed, connected, coupled or the like may include permanent (e.g., integral), removable, temporary, partial, full, and/or any other possible attachment option. Different cross-hatching is used throughout the figures to denote different parts but not necessarily to denote the same or different materials.

The steps recited in any of the method or process descriptions may be executed in any order and are not necessarily limited to the order presented. Furthermore, any reference to singular includes plural embodiments, and any reference to more than one component or step may include a singular embodiment or step. Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

Any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts or areas but not necessarily to denote the same or different materials. In some cases, reference coordinates may be specific to each figure.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a $B_4C$ layer as a component of an oxidation protection system on a carbon-carbon composite material, the method comprising:
    forming a liquid mixture comprising a boron-compound and a carbon-compound, wherein forming the liquid mixture comprises forming a solution by mixing the boron-compound into the carbon-compound, such that the boron-compound is a solute and the carbon-compound is a solvent, wherein the boron-compound is a precursor of boron carbide ($B_4C$), the boron-compound comprising at least one of boric acid ($H_3BO_3$) and boria ($B_2O_3$) and wherein the carbon-compound comprises phenolic resin;
    applying the liquid mixture on the carbon-carbon composite material, wherein the carbon-carbon composite material comprises a carbon densified carbon fiber preform; and
    heating the carbon-carbon composite material after applying the liquid mixture on the carbon-carbon composite material to convert the boron-compound and the carbon-compound of the liquid mixture to boron carbide ($B_4C$) and form a boron carbide ($B_4C$) layer over the carbon-carbon composite material,
    wherein heating the carbon-carbon composite material includes heating to between about 1800 degrees Celsius and about 2000 degrees Celsius.

2. The method of claim 1, wherein heating the carbon-carbon composite material is performed for one hour.

3. The method of claim 2, wherein heating the carbon-carbon composite material includes under an inert gas flow.

4. The method of claim 3, wherein heating the carbon-carbon composite material is performed under vacuum.

5. The method of claim 2, wherein heating the carbon-carbon composite material is a single heating step to form the boron carbide ($B_4C$) layer.

6. The method of claim 2, further comprising forming a silicon carbide layer on the boron carbide ($B_4C$) layer.

7. The method of claim 1, further comprising adjusting a viscosity of the liquid mixture before applying the liquid mixture on the carbon-carbon composite material, wherein adjusting the viscosity of the liquid mixture includes adding to the liquid mixture at least one of water, methanol, ethanol, propanol, and butanol.

8. A method of forming a $B_4C$ layer as a component of an oxidation protection system on a carbon-carbon composite material, the method comprising:
    forming a liquid mixture comprising a boron-compound and a carbon-compound, wherein forming the liquid mixture comprises forming a solution by mixing the boron-compound into the carbon-compound, such that the boron-compound is a solute and the carbon-compound is a solvent, wherein the boron-compound is a precursor of boron carbide ($B_4C$), the boron-compound comprising at least one of boric acid ($H_3BO_3$) and boria ($B_2O_3$) and wherein the carbon-compound comprises phenolic resin;
    applying the liquid mixture on the carbon-carbon composite material, wherein the carbon-carbon composite material comprises a carbon densified carbon fiber preform; and
    converting the boron-compound and the carbon-compound of the liquid mixture to boron carbide after applying the liquid mixture to the carbon-carbon composite material,
    wherein converting includes heating the carbon-carbon composite material to between about 1800 degrees Celsius and about 2000 degrees Celsius to convert the boron-compound to boron carbide ($B_4C$).

9. The method of claim 8, wherein heating is performed under at least one of an inert gas flow and a vacuum.

* * * * *